United States Patent
Takahashi et al.

(10) Patent No.: US 8,008,180 B2
(45) Date of Patent: Aug. 30, 2011

(54) METHOD OF FORMING AN OHMIC CONTACT ON A P-TYPE 4H-SIC SUBSTRATE

(75) Inventors: Yasuo Takahashi, Suita (JP); Masakatsu Maeda, Suita (JP); Akinori Seki, Shizuoka (JP); Akira Kawahashi, Kasugai (JP); Masahiro Sugimoto, Toyota (JP)

(73) Assignees: Toyota Jidosha Kabushiki Kaisha, Toyota-Shi, Aichi (JP); Osaka University, Suita-Shi, Osaka (JP)

( * ) Notice: Subject to any disclaimer, the term of this patent is extended or adjusted under 35 U.S.C. 154(b) by 52 days.

(21) Appl. No.: 12/530,901

(22) PCT Filed: Mar. 13, 2008

(86) PCT No.: PCT/JP2008/055158
§ 371 (c)(1),
(2), (4) Date: Sep. 11, 2009

(87) PCT Pub. No.: WO2008/114838
PCT Pub. Date: Sep. 25, 2008

(65) Prior Publication Data
US 2010/0102332 A1    Apr. 29, 2010

(30) Foreign Application Priority Data
Mar. 13, 2007   (JP) ................................. 2007-063814

(51) Int. Cl.
*H01L 21/44* (2006.01)
(52) U.S. Cl. ................ 438/597; 257/E21.054; 438/523; 438/602; 438/931

(58) Field of Classification Search ........... 257/E21.054; 438/523, 597, 602, 931
See application file for complete search history.

(56) References Cited

U.S. PATENT DOCUMENTS
6,747,291 B1 *  6/2004  Lu et al. ......................... 257/77

FOREIGN PATENT DOCUMENTS
| JP | 62071271 A | 4/1987 |
|---|---|---|
| JP | 3133176 A | 6/1991 |
| JP | 04085972 A | 3/1992 |
| JP | 2911122 | 6/1999 |
| JP | 2000101064 A | 4/2000 |
| JP | 2004152860 A | 5/2004 |
| JP | 2005277240 A | 10/2005 |

OTHER PUBLICATIONS

Brian J. Johnson, Michael A. Capano, "The effect of titanium on Al-Ti contacts to p-type 4H-SiC," Solid-State Electronics 47 (2003), pp. 1437-1441.

* cited by examiner

*Primary Examiner* — Asok K Sarkar
(74) *Attorney, Agent, or Firm* — Gifford, Krass, Sprinkle, Anderson & Citkowski, P.C.

(57) ABSTRACT

A method of forming an Ohmic contact on a P-type 4H—SiC and an Ohmic contact formed by the same are provided. A method of forming an Ohmic contact on a P-type 4H—SiC substrate including a deposition step of successively depositing a 1 to 60 nm thick first Al layer, Ti layer, and second Al layer on a P-type 4H—SiC substrate and an alloying step of forming an alloy layer between the SiC substrate and the Ti layer through the first Al layer by heat treatment in a nonoxidizing atmosphere. An Ohmic contact on a P-type 4H—SiC substrate formed by this method is also provided.

4 Claims, 4 Drawing Sheets

Fig.1
(1)
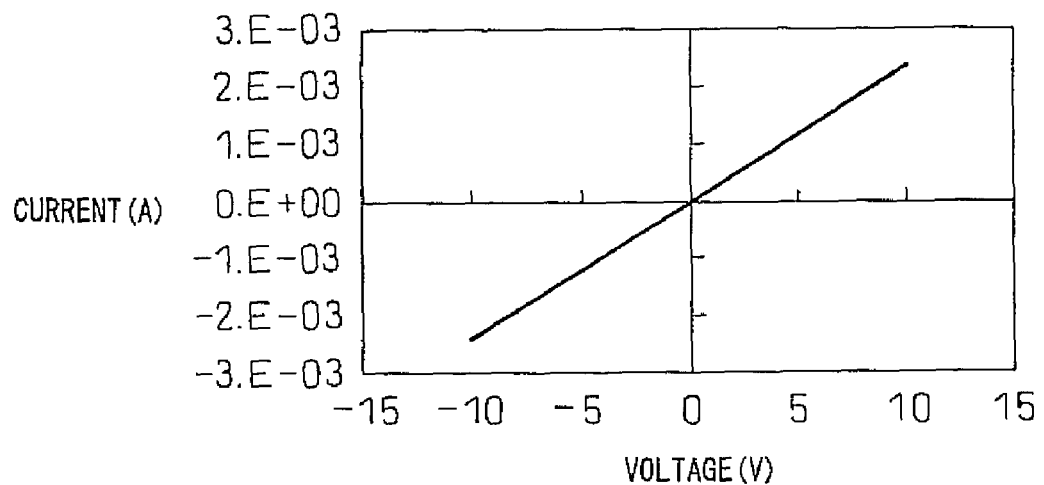
(2)
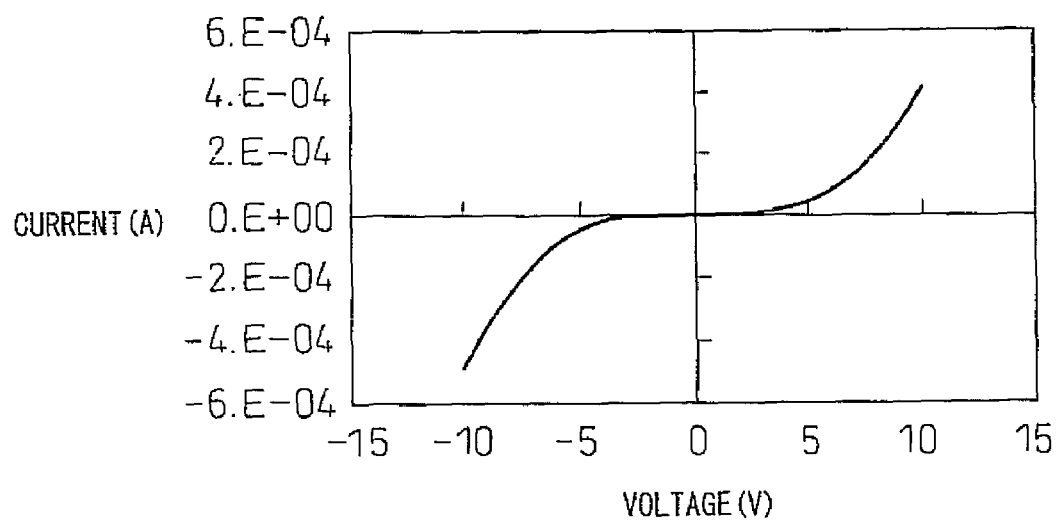

Fig.2
(1)
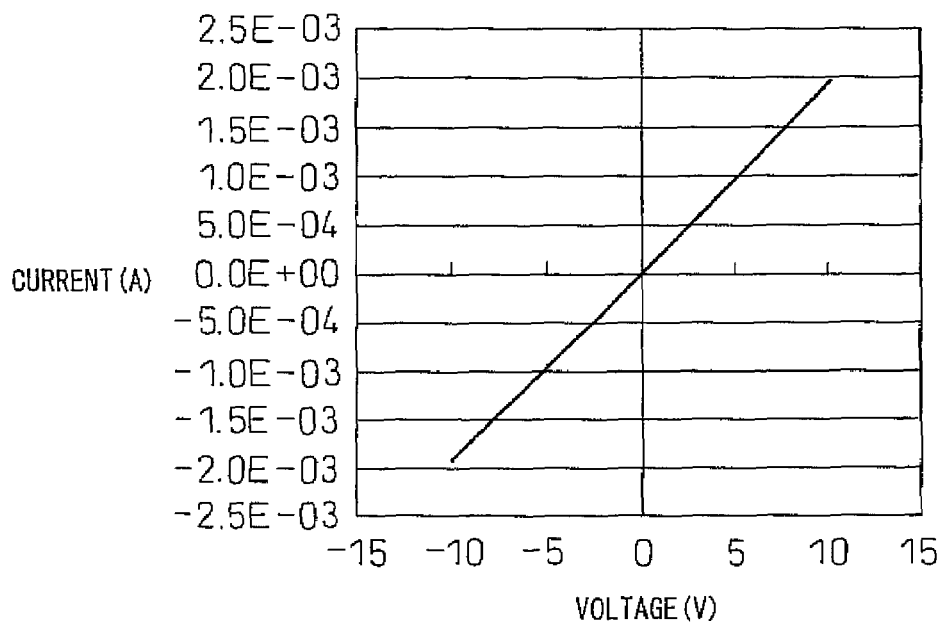
(2)
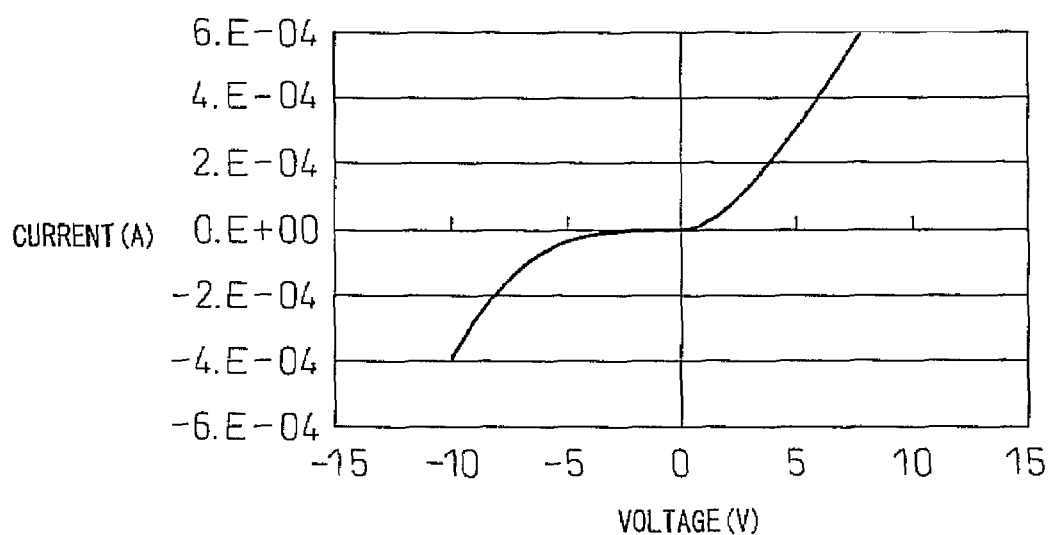

METHOD OF FORMING AN OHMIC CONTACT ON A P-TYPE 4H-SIC SUBSTRATE

TECHNICAL FIELD

The present invention relates to a method of forming an Ohmic contact on a P-type 4H—SiC substrate.

BACKGROUND ART

SiC (silicon carbide) has a wide bandgap and is considered promising as a high temperature, high frequency, and high output semiconductor material. SiC includes many crystal polytypes. Among them, the crystal polytype 4H SiC is noteworthy as a semiconductor material with the wide bandgap and superior in the above characteristics.

For commercialization of SiC semiconductor devices, measurement of the carrier mobility by the Hall characteristics and other evaluation of characteristics are necessary. For correct measurement, it is necessary to form a good Ohmic contact. However, the 4H polytype has a large bandgap as explained above, so obtaining Ohmic characteristics is difficult in comparison with other crystal polytypes. Further, in the case of P-type SiC, until now, no art for forming stable Ohmic contacts has been established.

In the past, Ohmic contacts using Ti/Al or Al/Ti/Al stacked structures have been developed.

For example, B. J. Johnson, M. A. Capano, Solid-State Electronics 47 (2003), 1437-1441 discloses the formation of contacts with small contact resistance of a Al/Ti/Al triple layer structure on P-type 4H—SiC. However, to realize Ohmic characteristics, heavy doping is necessary in the vicinity of the contact regions of the SiC. Along with it, various problems occur. First, in the heavily doped state, the characteristics inherent to SiC cannot be confirmed and the fundamental information for device design cannot be obtained. Further, when for example employing ion implantation for the heavy doping, heat treatment of at least 1800° C. is necessary in order to repair damages occurring in the SiC crystal. However, this is a high temperature in comparison to the 1600 to 1700° C., the temperature of formation of the SiC thin film by CVD and the like being liable to degrade the thin film quality and have a detrimental effect on the characteristics of thin film devices. Further, treatment steps including an ion implantation step and a repair step become excessively necessary. This complicates the device production process and makes it costly.

As an electrode formed on SiC with a structure similar to this, Japanese Patent Publication (A) No. 2005-277240 discloses an Ohmic contact comprised of Ni/Ti/Al layers on a SiC wafer. However, the carrier concentration is raised to secure the Ohmic characteristics, so this cannot be applied to evaluation of characteristic at low carrier concentrations such as in single crystal wafers and epitaxial layers.

Further, Japanese Patent Publication (A) No. 2000-101064 discloses a Ti, Al, or other metal electrode on a SiC wafer through Nb-doped $SrTiO_3$ or another conductive oxide. However, crystal polytypes are not shown. The possibility of application to the 4H-type is unclear.

Further, Japanese Patent No. 2911122 discloses to form a metal film exhibiting a stronger reaction to oxygen than P-type SiC by stacking an Al/Si Ohmic contact on top, then cause diffusion of the Al or Si by heat treatment. However, this raises the carrier concentration and lowers the contact resistance, so it is suitable for device contacts, but cannot be used for Hall measurement for evaluating the semiconductor characteristics inherent to SiC.

DISCLOSURE OF THE INVENTION

The objective of the present invention is to provide a method of forming an Ohmic contact on P-type 4H—SiC and an Ohmic contact formed by the same.

To achieve the above objective, according to the present invention, there is provided a method of forming an Ohmic contact on a P-type 4H—SiC substrate including a deposition step of successively depositing a 1 to 60 nm thick first Al layer, Ti layer, and second Al layer on a P-type 4H—SiC substrate and an alloying step of forming an alloy layer between the SiC substrate and the Ti layer through the first Al layer by heat treatment in a nonoxidizing atmosphere.

According to the present invention, there is further provided an Ohmic contact on a P-type 4H—SiC substrate formed by the above method.

According to the present invention, by forming a Ti layer on a SiC surface with a 1 to 60 nm thick first Al layer in between, then forming an alloy layer between the SiC substrate and Ti layer with the first Al layer in between by heat treatment in a nonoxidizing atmosphere, an electrode having Ohmic characteristics can be formed.

BRIEF DESCRIPTION OF THE DRAWINGS

FIG. 1 is a graph showing the results of measurement of the current and voltage of samples with contacts formed on top of a P-type 4H—SiC wafer by (1) the present invention method and (2) the conventional method.

FIG. 2 is a graph showing the results of measurement of the current and voltage of samples with contacts formed on top of a P-type 4H—SiC wafer by (1) a preferable embodiment of the present invention method and (2) a comparative method.

BEST MODE FOR CARRYING OUT THE INVENTION

Figure 3:
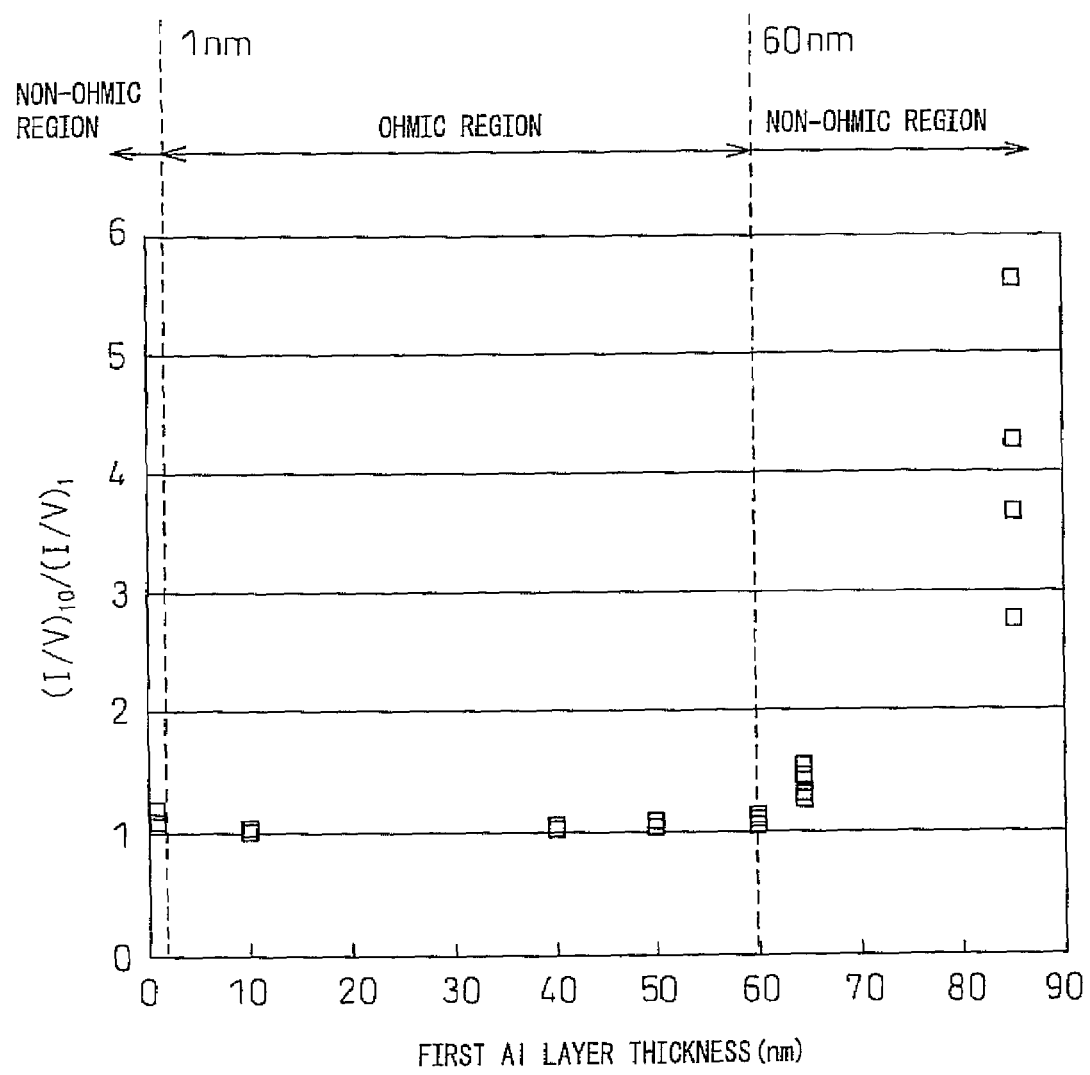
FIG. 3 is a graph showing the Ohmic indicator values for samples with a first Al layer/Ti layer/second Al layer formed on a P-type 4H—SiC wafer while changing the thickness of the first Al layer.

The Ohmic contact of the present invention is a structure with a Ti/Al two-layer structure contact formed on a SiC substrate using a Ti—Al—Si—C quarternary alloy layer formed by alloying of the SiC substrate, a first Al layer, and a Ti layer as an interface layer. Details of the above alloying reaction and the various phases forming the quarternary alloy interface layer created by the same are currently not fully understood, however, the mechanism of the reaction and the formed phases having substantial effects on the Ohmic characteristics are considered to be as follows.

To realize an Ohmic contact using a Ti/Al stacked structure on a SiC substrate, it is thought necessary to form $Ti_3SiC_2$ at the SiC substrate/Ti interface and to form a $Ti_3SiC_2$/SiC interface structure lowering the Schottky barrier.

Forming a Ti layer on the SiC substrate through the first Al layer promotes the formation of $Ti_3SiC_2$. That is, if SiC and Ti react directly without the mediation of the first Al layer, reactions forming not $Ti_3SiC_2$, but $Ti_5Si_3C_X$ or TiC with priority at the interface are promoted. $Ti_5Si_3C_X$ or TiC further reacts along with the prolonged time resulting finally in the formation of $Ti_3SiC_2$. However, once $Ti_5Si_3C_X$ or TiC is formed at the interface, the chemical potentials of the constituent elements Ti, Si, and C fall, so the driving force to form $Ti_3SiC_2$ (amount of change of Gibbs free energy) falls as well and the formation of $Ti_3SiC_2$ is inhibited. Therefore, an extremely long period of time (several to several dozen hours) will be needed. In the end, the structure becomes on one in which low conductivity $Ti_5Si_3C_X$, TiC, and other compounds are present at the interface, so Ohmic characteristics are difficult to obtain.

By interposing a first Al layer between the SiC substrate and the Ti layer, $Al_3Ti$ is formed during the alloying heat treatment and the SiC and Ti indirectly react through this, so the formation of $Ti_5Si_3C_X$, TiC, and the like by the direct reaction of the two is suppressed and an interfacial reaction can be induced where a reaction path forming $Ti_3SiC_2$ without passing through these phases is selected.

The first Al layer between the SiC substrate and Ti layer further reduces and breaks down the natural oxide film $SiO_2$ formed covering the SiC substrate surface. Below, details will be explained.

By heat treating contacts of which structure is (SiC/SiO2/Al/Ti/Al) before heat treatment, the Al melts and the following two interfacial reactions (1) and (2) proceed.

$$SiO_2 + Al(liq.) = Al(Si,O)(liq.) \quad (1)$$

$$Ti + 3Al(liq.) = Al_3Ti \quad (2)$$

The reaction (1) is the reduction of the surface oxide film of SiC, that is, $SiO_2$, at the $SiO_2$/Al interface and the dissolution of the reduced Si and oxygen in the Al melt. Due to this, the cleaned (activated) surface of the SiC is exposed to the contact material.

The reaction (2) is the reaction forming $Al_3Ti$ at the Ti/Al (liq.) interface at the two sides of the Ti layer. The $Al_3Ti$ grows into a layer shape at the Ti/Al interface so long as no abnormal convection of the Al melt occurs due to non homogeneous temperature in the contact region etc.

On the other hand, the second Al layer is not completely consumed by the reaction (2), so Al melt remains on the $Al_3Ti$. This is one necessary condition to keep Al—Ti-based intermetallic compounds other than $Al_3Ti$ from forming.

In this way, the electrode becomes SiC/$Al_3Ti$/Al (liq.).

By the next heat treatment, the following interfacial reaction (3) proceeds:

$$2SiC + 3Al_3Ti = Ti_3SiC_2 + Si + 9Al \quad (3)$$

Through the reaction (3), the SiC is contacted and $Ti_3SiC_2$ is formed. The growth front of $Ti_3SiC_2$ is on the $Ti_3SiC_2$/$Al_3Ti$ interface side. Accordingly, Si and C diffuse in $Ti_3SiC_2$ and are fed to the growth surface of $Ti_3SiC_2$. The Al and Si formed by the reaction (3) are exhausted to the Al melt through the $Al_3Ti$. The $Al_3Ti$ can dissolve a considerable amount of Si, therefore the diffusion path which Al and Si take in the $Al_3Ti$ to reach the Al melt can be stably established.

Through the above interfacial reactions, a contact having a SiC/$Ti_3SiC_2$/$(Al,Si)_3Ti$/Al(Si) (liq.) stacked structure is formed at the interface.

By the above, a contact fabricated by the present invention is presumed to be one with Ohmic characteristics.

The P-type 4H—SiC substrate used in the present invention is a SiC wafer or an epitaxially grown SiC thin film on top of the same. The carrier concentration should be $1 \times 10^{19}$ $cm^{-3}$ or less or may be $1 \times 10^{18}$ $cm^{-3}$ or less In the present invention, the thickness of the first Al layer between the SiC substrate and the Ti layer is limited to the range of 1 to 60 nm.

If the thickness is less than 1 nm, the Al layer is formed not as a continuous layer but as separate island shapes, so cannot continuously cover the SiC substrate surface. The above action of preventing the direct reaction of the SiC substrate and the Ti layer cannot be obtained. In particular, when the Al is a liquid phase at the alloying heat treatment temperature, there is a strong tendency for it to form island shapes because of the low wettability of the Al liquid phase with SiC.

On the other hand, if the thickness is over 60 nm, the action of reducing and breaking down the $SiO_2$ can be obtained, but the first Al layer ends up acting more as an obstacle than as a medium for the reaction between the SiC substrate and the Ti layer.

In this case as well, in particular when the Al is a liquid phase at the alloying heat treatment temperature, the wettability of the Al liquid phase and the SiC is low. Therefore, even with a continuous film as a solid phase film, it will not be a continuous film as a liquid phase film, but will become droplets breaking up into separate island shapes. The contact surface area with the SiC will drop and both the reduction and breakup action and the reaction medium action will become insufficient.

The ratio of the layer thickness between the first Al layer and the Ti layer (first Al thickness/Ti thickness) is preferably 1.42 or less. In order for the SiC to react with the first Al layer/Ti layer and form a low resistance $Ti_3SiC_2$ layer, the formation of $Al_3Ti$ is necessary in the process leading to its composition. However, when the first Al layer is thicker than the above layer thickness ratio, unreacted Al remains at the interface thereby hindering the formation of a uniform $Ti_3SiC_2$ layer.

The alloying heat treatment temperature is preferably 900° C. to 1200° C. In this temperature region, the first Al layer becomes a liquid phase and the intermediary action on the reaction between SiC and Ti and the action of reduction and breakdown of the $SiO_2$ are easily realized.

EXAMPLES

Example 1

A P-type 4H—SiC wafer (specific resistance: 200 to 500 Ωcm, diameter: 50 mm) was washed by acetone so as to clean the surface.

A metal mask formed with film forming parts at four locations was attached to this wafer. The wafer was loaded into a vacuum deposition system which was then evacuated to a vacuum of $10^{-3}$ Pa or less. In that state, layers were continuously deposited in the order of the following (1) to (3) to form contact precursors of an Al/Ti/Al three-layer stacked structure:

(1) First Al layer: Thickness 10 nm (material purity: 99.99% or higher)
(2) Ti layer: Thickness 80 nm (material purity: 99.9% or higher)
(3) Second Al layer: Thickness 380 nm (material purity: 99.99% or higher)

As a vacuum deposition system, an electron beam evaporator was used. However, the invention is not limited to this. A sputtering deposition system, resistance heating deposition system, or any other system capable of forming a film in a clean atmosphere (vacuum or an inert gas) may be used.

Further, each layer of (1) to (3) is preferably deposited continuously as in the present embodiment. If exposed to the ambient atmosphere during the process, the entry of oxygen, nitrogen, CH, and the like is liable to hinder obtaining electrodes with good Ohmic characteristics.

The wafer formed with above three-layer stacked structure contact precursors was loaded into an electric furnace, raised to a temperature of 1000° C. in an 1.3 kPa Ar atmosphere, and held there for 5 minutes for an alloying heat treatment. Due to this, electrodes comprised of a Ti layer/Al layer were completed at four locations on the SiC substrate using the alloy layer as an interface layer. Note that, the alloying heat treatment atmosphere may be an Ar, He, $N_2$, or other inert gas, $H_2$ or other reducing gas, vacuum, or other non-oxidizing atmosphere.

Using the obtained four locations, the current and voltage were measured between each two terminals. For comparison, the same treatment was performed other than not forming the first Al layer of the above (1) to obtain a conventional example. This was measured for current and voltage in the same way. The measurement results are shown in FIG. 1.

FIG. 1 (1) shows the measurement results for a sample obtained by forming and alloying a first Al layer/Ti layer/second Al layer on a P-type 4H—SiC substrate by the method of the present invention, while (2) shows the measurement results for a sample obtained by forming and alloying a Ti layer/Al layer on a P-type 4H—SiC substrate by a conventional method.

As shown in FIG. 1 (1), a contact obtained by the method of the present invention has good Ohmic characteristics.

In contrast, the conventional example of FIG. 1 (2) does not exhibit Ohmic characteristics.

The example of the present invention was measured for specific electrical resistance by the van der Pauw method and measured by Hall measurement. As a result, a specific electrical resistance of 300Ω, a Hall mobility of 24 $cm^2/V \cdot sec$, and a carrier mobility of $9 \times 10^{14}$ $cm^{-3}$ were obtained.

Example 2

Contacts were formed on an SiC wafer by the same procedure and conditions as in Example 1.

However, after washing by acetone, the wafer was further washed by hydrofluoric acid solution to remove the natural oxide film on the SiC wafer surface, then the films were formed. Further, the alloying heat treatment after film formation was performed in the same way as in Example 1 by raising the wafer in temperature to 1000° C. (the same temperature as in Example 1 and holding it there for 2 minutes (shorter time than Example 1). For comparison, the same treatment was performed as the above (the same temperature as Example 1 and shorter time) except for not washing the wafer by aqueous hydrofluoric acid (to obtain the same wafer surface state as Example 1).

The sample obtained in the above way was measured for current and voltage in the same way as Example 1. The measurement results are shown in FIG. 2.

As shown in FIG. 2 (1), the sample obtained by removing the oxide film by the aqueous hydrofluoric acid exhibited good Ohmic characteristics. As opposed to this, the sample where the oxide film was not removed by hydrofluoric acid solution, as shown in FIG. 2 (2), did not exhibit Ohmic characteristics.

In this way, Example 2, where the natural oxide film was removed by hydrofluoric acid solution, can exhibit Ohmic characteristics even if shortening the holding time in the alloying heat treatment in comparison to Example 1 where this was not performed. If shortening the holding time of the alloying heat treatment without removing the natural oxide film by hydrofluoric acid solution as in the comparative sample of Example 2, Ohmic characteristics cannot be obtained.

Further, in the measurements of Example 1, it was necessary to press a measurement probe or apply a high voltage (10V) several times before measurement in order to remove the oxide film formed on the electrode surface, however, in the measurement of Example 2, measurement was possible by a voltage of about 1V.

Further, it was confirmed that good Ohmic characteristics can be obtained in the same way as Examples 1 and 2 by the same procedure and conditions as in Example 2 even when making the alloying heat treatment temperature 950° C. (lower temperature than Example 1) and making the holding time 5 minutes (same as Example 1).

In this way, the washing treatment of the SiC wafer surface by hydrofluoric acid solution has an extremely preferable effect in terms of the expression of Ohmic characteristics. Washing by a hydrofluoric acid solution has a large ability to remove $SiO_2$, so the difference in the temperature or time of alloying heat treatment for expressing Ohmic characteristics in example 1 and example 2 are thought to be effects of the natural oxide film $SiO_2$ formed covering the SiC wafer surface being interposed between the electrode layer formed on top of the same and the SiC wafer surface.

Even if washing by hydrofluoric acid solution to remove the oxide film, an oxide film will probably be formed again before the film formation ends, however, the re-formed oxide film is extremely thin in comparison to the original oxide film, so it is thought that it will be removed by being reduced and broken down by the Al during the alloying heat treatment after formation of the contact layer and therefore will not detract from the Ohmic characteristics.

If forming the films and performing the alloying heat treatment without the $SiO_2$ film being sufficiently removed and ending up finishing formation of $Al_3Ti$ by the reaction of the first Al layer and the Ti layer, the interface structure will become $SiC/SiO_2/Al_3Ti$, and $SiO_2$ having a high insulation will remain and become interposed in the interface layer. This remaining $SiO_2$ film will act as a barrier to diffusion inhibiting formation of $Ti_3SiC_2$ by the reaction between the SiC and $Al_3Ti$, therefore making the formation of $Ti_3SiC_2$ by a short heat treatment difficult. As a result, it is believed, not only will the interface layer not become $SiC/Ti_3SiC_2$ lowering the Schottky barrier, but also an $SiO_2$ insulating film will be interposed at the interface, so good Ohmic characteristics will no longer be expressed.

Example 3

Contacts were formed on a P-type 4H—SiC wafer by the same procedure and conditions as in Example 1.

However, the thickness of the first Al layer was changed variously as in Table 1. The current and voltage were measured for each obtained sample similarly to Example 1. The Ohmic characteristics of these samples were compared using the following indicator:

<Ohmic Characteristic Indicator>

Indicator=$(I/V)_{10}/(I/V)_1$ where, $(I/V)_{10}$: ratio of current value I/voltage value V in applied voltage 10V $(I/V)_1$: ratio of current value I/voltage value V in applied voltage 1V When the ideal Ohmic characteristics are obtained, indicator=1.

The indicator values obtained by measuring each sample repeatedly (n)=4 number of times are shown in Table 1.

TABLE 1

| Layer thickness (nm) | Ohmic characteristic indicator value $(I/V)_{10}/(I/V)_1$ | | | |
|---|---|---|---|---|
| 1 | 1.176 | 1.086 | — | — |
| 10 | 1.036 | 1.032 | 1.019 | 1.017 |
| 40 | 1.032 | 1.043 | 1.046 | 1.053 |
| 50 | 1.029 | 1.030 | 1.088 | 1.088 |
| 60 | 1.119 | 1.109 | 1.062 | 1.061 |
| 64.3 | 1.458 | 1.541 | 1.315 | 1.250 |
| 85.3 | 3.634 | 2.741 | 4.246 | 5.592 |

Number n of repeated measurements = 4 (provided that for layer thickness of 1 nm, n = 2)

Further, FIG. 3 plots Ohmic characteristic indicator values with respect to the thickness of the first Al layer.

It is clear from the results shown in Table 1 and FIG. 3 that when the thickness of the first Al layer is within 1 nm to 60 nm in range, the Ohmic characteristic indicator becomes substantially 1, that is, extremely good Ohmic characteristics are given close to the ideal.

Example 4

Figure 4:
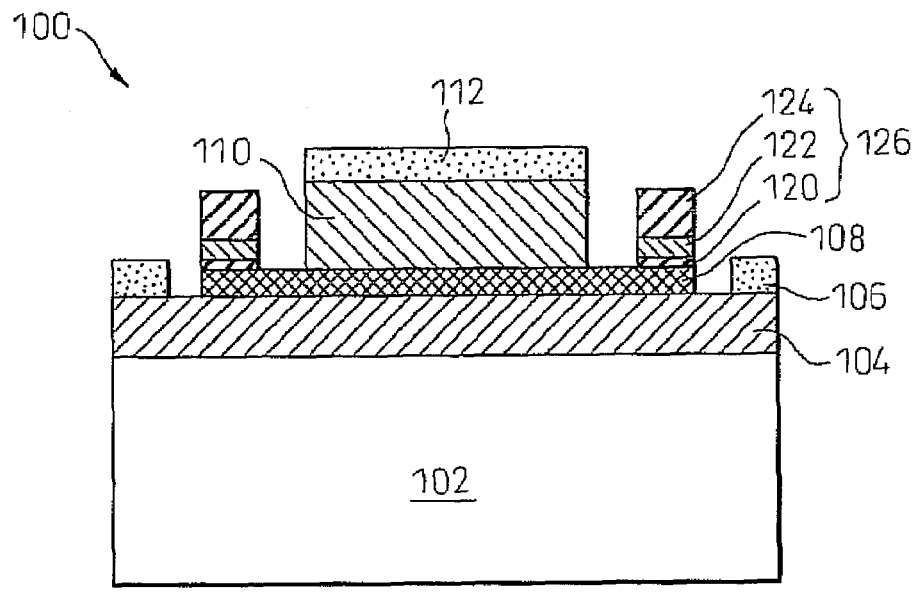
FIG. 4 is a cross-sectional view showing an example of a structure applying an Ohmic contact of the present invention for a P-type layer contact (base contact) of a 4H—SiC bipolar transistor.

FIG. 4 shows an example of a structure using an Ohmic contact of the present invention for a P-type electrode (base electrode) of a 4H—SiC bipolar transistor.

The illustrated bipolar transistor 100 is provided, on top of a N-type 4H—SiC wafer 102, with a collector layer 104 comprised of an N-type 4H—SiC epitaxial layer, an N-type collector electrode 106, a base layer 108 comprised of a P-type 4H—SiC epitaxial layer, an emitter layer 110 comprised of an N-type 4H—SiC epitaxial layer, an N-type emitter electrode 112, and a base electrode 126 using the Ohmic contact of the present invention.

The base electrode 126, for convenience in explanation, is shown as a first Al layer 120 (thickness 10 nm)/Ti layer 122 (thickness 80 nm)/second Al layer 124 (thickness 380 nm) from the bottom up in a state after film formation but before alloying heat treatment. However, in actuality, due to the alloying heat treatment, at the position of the first Al layer 120, an alloy layer is formed from the Si and C of the P-type 4H—SiC epitaxial layer 108, Al of the first Al layer 120, and Ti of the Ti layer 122 and an interfacial structure of an SiC substrate/alloy layer/Ti layer should be formed, but the details of the alloy composition and the constituent phases of the alloy layer are currently not yet certain. However, it is considered that at least a $Ti_3SiC_2$ phase is included in the alloy layer.

Example 5

Figure 5:
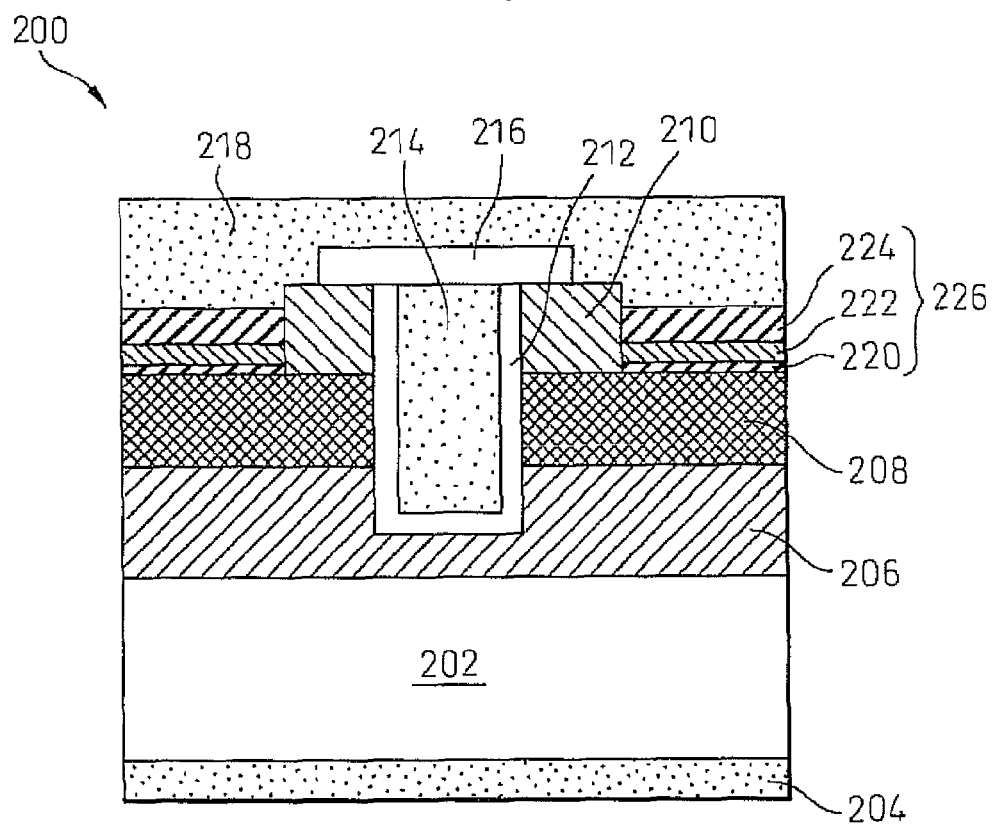
FIG. 5 is a cross-sectional view showing an example of a structure applying an Ohmic contact of the present invention for a P-type layer contact of a 4H—SiC MOSFET.

FIG. 5 shows an example of a structure using an Ohmic contact of the present invention for a P-type layer electrode of a 4H—SiC MOSFET.

The illustrated MOSFET 200 is provided with, on an $N^+$-type 4H—SiC wafer 202, a N-type 4H—SiC epitaxial layer 206, P-type 4H—SiC epitaxial layer 208, $N^+$4H—SiC epitaxial layer 210, gate insulator 212, gate electrode 214, interlayer dielectric film 216, N-type layer source electrode 218, and P-type electrode 226 using an Ohmic contact of the present invention. At the back surface of the SiC wafer 202, there is provided a drain electrode 204.

The P-type electrode 226, for convenience in explanation, is shown as a first Al layer 220 (thickness 10 nm)/Ti layer 222 (thickness 80 nm)/second Al layer 224 (thickness 380 nm) from the bottom up in a state after film formation but before alloying heat treatment. However, in actuality, due to the alloying heat treatment, at the position of the first Al layer 220, an alloy layer is formed from the Si and C of the P-type 4H—SiC epitaxial layer 208, Al of the first Al layer 220, and Ti of the Ti layer 222 and an interfacial structure of an SiC substrate/alloy layer/Ti layer should be formed, but the details of the alloy composition and the constituent phases of the alloy layer are currently not yet certain. However, it is considered that at least a $Ti_3SiC_2$ phase is included in the alloy layer. In particular, in the device structure of the present embodiment, because an ion implantation step is unnecessary, there is the advantage that a flat MOSFET channel structure is obtained.

In this way, not only can the Ohmic contact of the present invention be evaluated for characteristics by Hall measurement of the SiC wafer or SiC epitaxial layer, but also it can be used as an electrode of an actual SiC semiconductor device.

INDUSTRIAL APPLICABILITY

According to the present invention, there is provided a method of forming an Ohmic contact on a P-type 4H—SiC and an Ohmic contact formed by the same.

The Ohmic contact according to the present invention can express good Ohmic characteristics without requiring ion implantation as in the prior art, therefore Hall measurement can be performed on a SiC wafer or an epitaxially grown SiC thin film on top of the same in its normal state so as to evaluate the carrier concentration, carrier mobility, etc. which are fundamental information in semiconductor device development.

Further, the invention is useful not only for evaluation of characteristics, but also as a device electrode not requiring ion implantation.

The invention claimed is:

1. The method of forming an Ohmic contact on a P-type 4H—SiC substrate including a deposition step of successively depositing a 1 to 60 nm thick first Al layer, Ti layer, and second Al layer on the P-type 4H—SiC substrate and an alloying step of forming an alloy layer between the SiC substrate and the Ti layer through the mediation of the first Al layer by heat treatment in a nonoxidizing atmosphere.

2. The method as set forth in claim 1, further comprising a step, before the deposition step, of washing a surface of the SiC substrate by hydrofluoric acid solution.

3. An Ohmic contact on a P-type 4H—SiC substrate formed by the method set forth in claim 2.

4. An Ohmic contact on a P-type 4H—SiC substrate formed by the method set forth in claim 1.

* * * * *